United States Patent
Schultz (10) Patent No.: US 9,213,071 B2
(45) Date of Patent: Dec. 15, 2015

(54) SENSOR SINGLE TRACK TRIM USING STATIONARY HARDWARE AND FIELDS

(71) Applicant: Peter S. Schultz, Gilbert, AZ (US)

(72) Inventor: Peter S. Schultz, Gilbert, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 582 days.

(21) Appl. No.: 13/663,998

(22) Filed: Oct. 30, 2012

(65) Prior Publication Data

US 2014/0122013 A1 May 1, 2014

(51) Int. Cl.
| | |
|---|---|
| G01L 25/00 | (2006.01) |
| G01D 21/00 | (2006.01) |
| G06F 17/40 | (2006.01) |
| G06F 19/00 | (2011.01) |
| G01R 33/028 | (2006.01) |
| G01P 15/18 | (2013.01) |
| G01R 33/00 | (2006.01) |
| G01R 33/02 | (2006.01) |
| G01P 21/00 | (2006.01) |

(52) U.S. Cl.
CPC ............ *G01R 33/0286* (2013.01); *G01D 21/00* (2013.01); *G01L 25/00* (2013.01); *G01P 15/18* (2013.01); *G01P 21/00* (2013.01); *G01R 33/0035* (2013.01); *G01R 33/0206* (2013.01); *G06F 17/40* (2013.01); *G06F 19/00* (2013.01)

(58) Field of Classification Search
None
See application file for complete search history.

(56) References Cited

U.S. PATENT DOCUMENTS

| | | | | |
|---|---|---|---|---|
| 4,998,441 | A | * | 3/1991 | Stuart ..................... 73/862.043 |
| 5,694,037 | A | * | 12/1997 | Palstra et al. ................. 324/202 |
| 6,954,698 | B2 | * | 10/2005 | Tryggvason ..................... 702/5 |
| 7,252,144 | B2 | * | 8/2007 | Estes et al. ................. 166/255.2 |
| 2004/0000910 | A1 | * | 1/2004 | Tryggvason .................. 324/331 |
| 2005/0199425 | A1 | * | 9/2005 | Estes et al. ...................... 175/50 |
| 2008/0234533 | A1 | * | 9/2008 | Vollum ............................. 600/9 |
| 2011/0298710 | A1 | * | 12/2011 | Ruckhaeberle et al. ...... 345/158 |

* cited by examiner

*Primary Examiner* — Edward Cosimano
(74) *Attorney, Agent, or Firm* — Jonathan N. Geld (57) ABSTRACT

A testing environment is provided in which both accelerometers and magnetometers can be tested in parallel, thereby decreasing the total cycle time for testing a semiconductor device package containing those devices. Embodiments of the present invention can also be configured to test singulated packages, thereby providing a tested and trimmed product that more accurately reflects the package delivered to the customer. In one embodiment, a series of device test locations within a testing region are configured to provide a known relationship with multiple fields of force. The device test locations are configured to provide sensitivity data from the packaged sensors in response to the directional forces. Embodiments provide a mechanism to transport the sensor packages from a device test location to a next device test location.

20 Claims, 5 Drawing Sheets

SENSOR SINGLE TRACK TRIM USING STATIONARY HARDWARE AND FIELDS

BACKGROUND

1. Field

This disclosure relates generally to trimming of semiconductor sensor devices, and more specifically, to a system, apparatus, and method for trimming two or more types of directionally-sensitive sensors in a package in parallel.

2. Related Art

The rapid growth in the use and availability of portable consumer electronic devices has brought about a corresponding growth in numbers and types of sensors associated with such devices. For example, many smart phone devices and tablet devices incorporate accelerometers, magnetometers, and gyroscopes to enable and enhance aspects of the user experience. In order to accommodate multiple types of sensors in a space conserving manner, sensor providers may include more than one type of sensor in a single semiconductor device package. Each type of sensor in a package must be calibrated, or trimmed, during the manufacturing process.

For multiple sensor packages, testing of each type of sensor is typically performed separately. For example, a package incorporating an accelerometer and a magnetometer can be tested and trimmed for response to gravity (for the accelerometer), and then tested and trimmed for response to a magnetic field (for the magnetometer). Such sequential testing can double the time necessary to test such packages. Current testing methods do not necessarily test and trim the multiple sensor package in an environment of use. For example, panels of un-singulated die can be accelerometer tested, but this does not provide the same package stress configuration as would be found during normal use (e.g., for singulated packages). This is an important issue because a typical accelerometer is a micro electromechanical systems package (MEMS), which has moving parts whose movement is sensitive to package stresses.

Another drawback of current testing methodology is that the sensor packages are oriented within the fields to which they respond (e.g., gravity) using complex gimbaled devices that can take significant time to position the device under test in a precise angle to the field of interest. Further, such complex devices can be both costly and resource intensive to maintain and support. In addition, the gimbal equipment used to orient the device can disturb a magnetic field, causing a lack of uniformity in the field and a corresponding lack of consistency in measurements.

Traditional methods of magnetometer testing introduce additional drawbacks. Typically, magnetometer testing is performed by positioning the magnetometer within a set of coils that form the magnetic field. The coils are typically started and stopped repeatedly as sensor devices are placed within and removed from the magnetic field. The coils are inductors, and therefore introduce problems related to overshooting the desired magnetic field strength and then have a dampened oscillation as the magnetic field comes to a steady-state. Magnetic field overshoots can, in some cases, expose the magnetometer to magnetic field strength greater than that for which the magnetometer is designed. Further, the time taken for the magnetic field to come to a steady-state can slow the testing and trimming process for the magnetometers.

It is therefore desirable to have a sensor testing methodology that simplifies the mechanisms required to test each of the types of sensors within a package, improves the testing and trimming cycle time for each sensor package, and enhances the accuracy of testing and trimming for finished, singulated products.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Embodiments of the present invention provide a testing environment in which both accelerometers and magnetometers can be tested in parallel, thereby decreasing the total cycle time for testing a sensor package containing those devices. Embodiments of the present invention can also be configured to test singulated packages, thereby providing a tested and trimmed product that more accurately reflects the package delivered to the customer. In one embodiment, a series of device test locations within a testing region are configured to provide a known relationship with multiple fields of force. The device test locations are configured to provide sensitivity data from the packaged sensors in response to the directional forces. Embodiments provide a mechanism to transport the sensor packages from a device test location to a next device test location.

One embodiment of the present invention is configured to test packages containing both 3-axis accelerometers and 3-axis magnetometers. Magnetic and gravitational fields are tested together by including the testing region within a magnetic field generated by, for example, a pair of Helmholtz coils. The magnetic field can be left continuously active during the testing process, thereby avoiding magnetic field overshoots issues and delays associated with cycling the power to coils generating the magnetic field.

Figure 1:
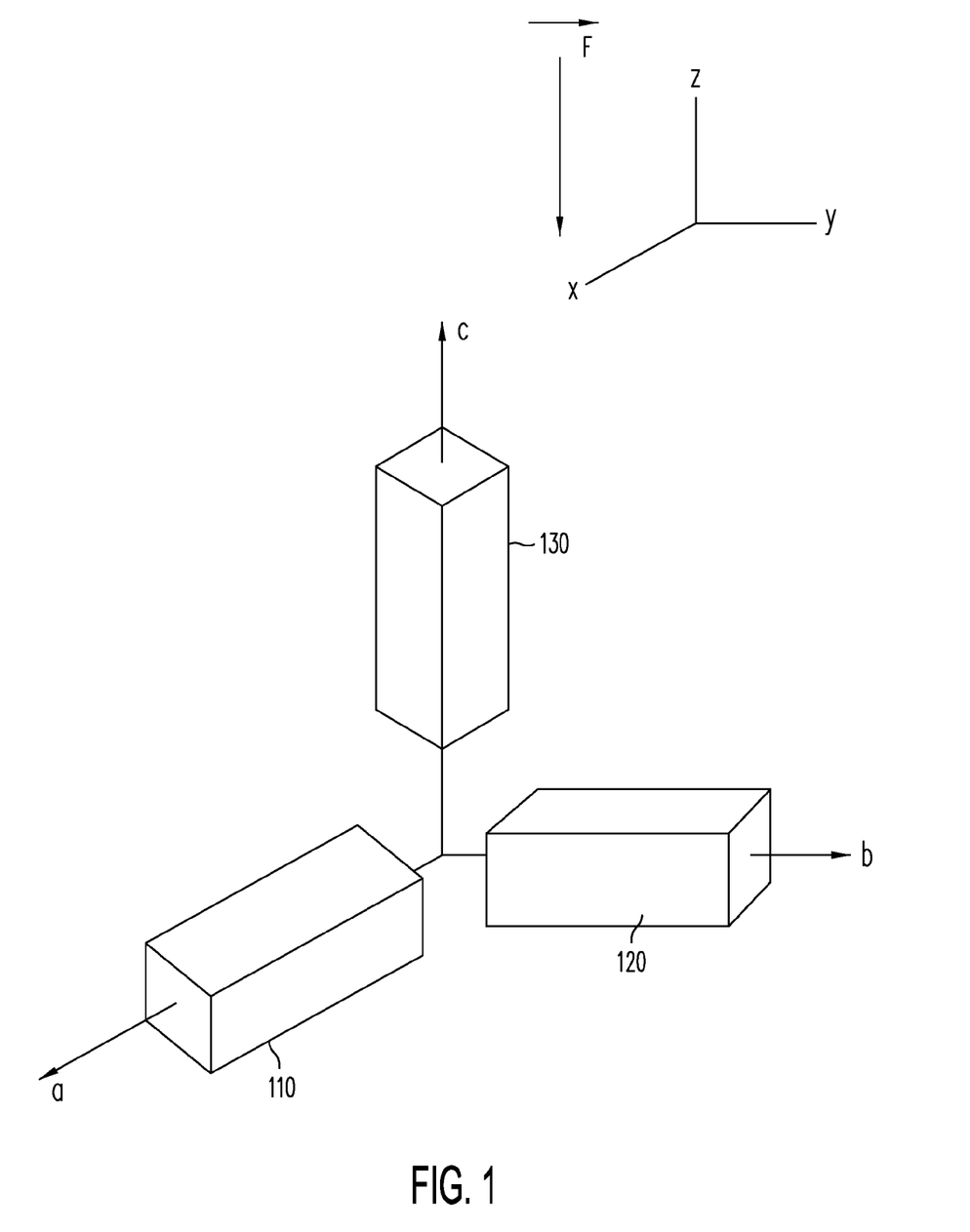
FIG. 1 is a simplified block diagram illustrating a three-axis sensor configuration.

FIG. 1 is a simplified block diagram illustrating a three-axis sensor configuration. Directionally-sensitive sensors 110, 120, and 130 have an orthogonal relative orientation on coordinate axes A, B, C. As illustrated, coordinate axes A, B, C are oriented in alignment with coordinate axes X, Y, Z, which, in turn are oriented in alignment with a force vector F. Force vector F is associated with a directional force (e.g., gravity), which the sensors are configured to detect, and is asserted upon the set of directionally sensitive sensors along the Z axis. Since each sensor is sensitive to the force applied along that sensor's axis of orientation, only directionally-sensitive sensor 130 should produce a data signal in response to force vector F.

When testing the directionally-sensitive sensors of FIG. 1, if directionally sensitive sensors 110 and 120 produce a data signal in response to being exposed to force vector F, even though the sensors should not produce such a signal, information related to the signal can be used to calibrate directionally-sensitive sensors 110 and 120 so that the sensors provide an appropriate reading for this orientation to the force vector (e.g., zero). Further, if the magnitude of force vector F is known, then information related to the data signal produced by directionally sensitive sensor 130 can be used to calibrate that sensor to provide an appropriate reading for the known force.

In order to gather data about each of the directionally-sensitive sensors response to force vector F, a package containing the orthogonally-oriented sensors can be rotated in relation to the associated force so as to generate a response from each of the directionally sensitive sensors. The sensor data gathered can be used to calibrate each of the sensors in the set. The process of gathering data and using that data for calibration is often known as trimming. As will be discussed in greater detail below, the trimming process further includes storing calibration parameters in a memory associated with the sensor devices.

Figure 2:
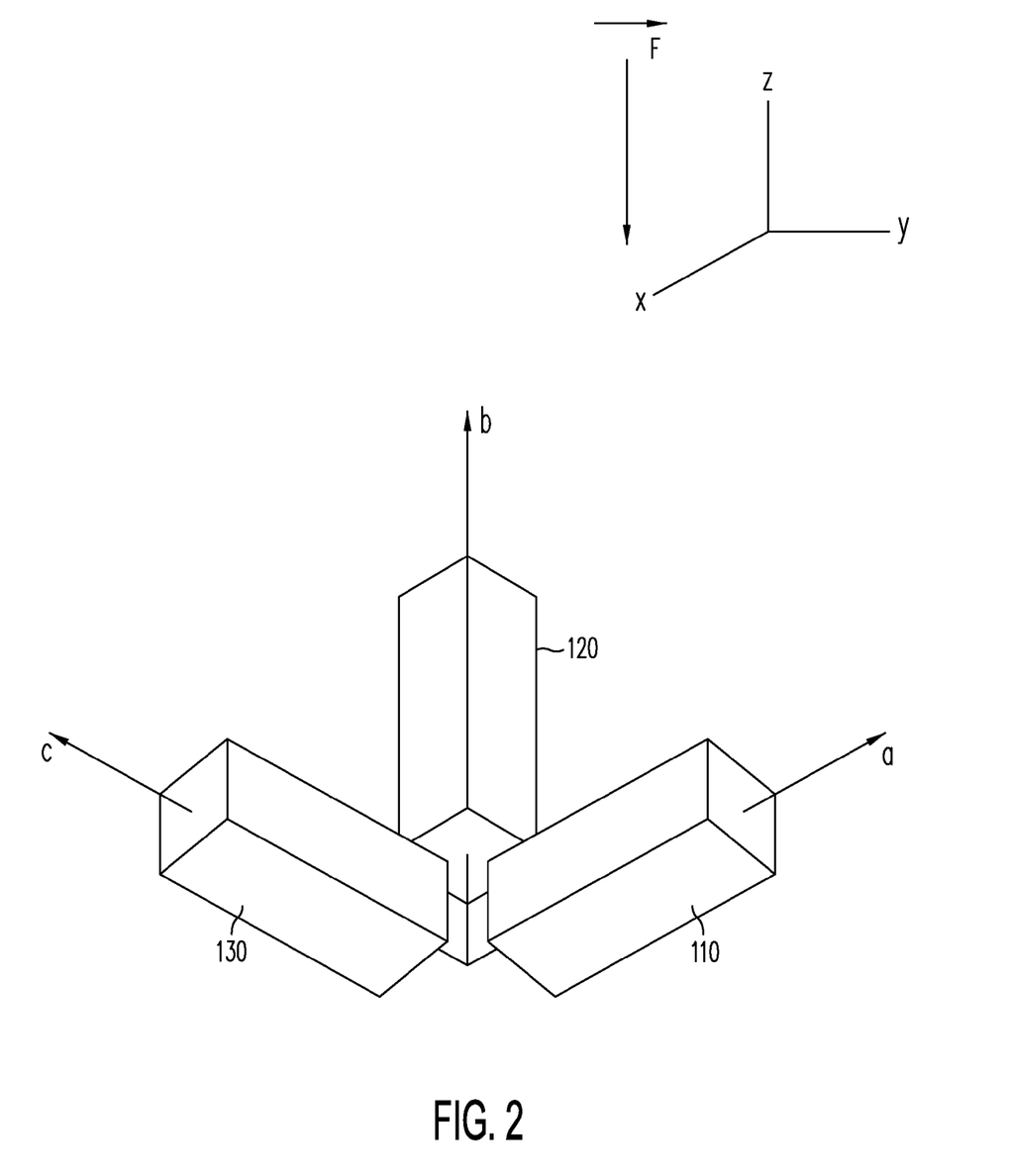
FIG. 2 is a simplified block diagram illustrating a rotated orientation of the three-axis sensor configuration shown in FIG. 1.

FIG. 2 is a simplified block diagram illustrating a rotated orientation of the three-axis sensor configuration shown in FIG. 1. As illustrated in FIG. 2, the coordinate axes of the three-axis sensor configuration are rotated out of alignment with the X,Y,Z coordinate axes. In such a configuration, each of the directionally-sensitive sensors will register a response to force vector F. In one example, the three-axis sensor configuration is rotated such that each of the sensors is at a same angle with respect to force vector F. In such an orientation, each sensor should respond with the same data signal. Differences between the data signals produced by each of the directionally-sensitive sensors can also be used for calibration purposes.

There are a variety of types of directionally-sensitive sensors. Common consumer devices, such as smart phones, may incorporate both accelerometers and magnetometers to enable and enhance functionality. Both the accelerometers and magnetometers should be trimmed prior to providing a semiconductor device package containing those sensors to the manufacturer of the consumer device. Embodiments of the present invention provide a mechanism by which the sensor devices can be trimmed in a more efficient manner than that traditionally used.

Figure 3:
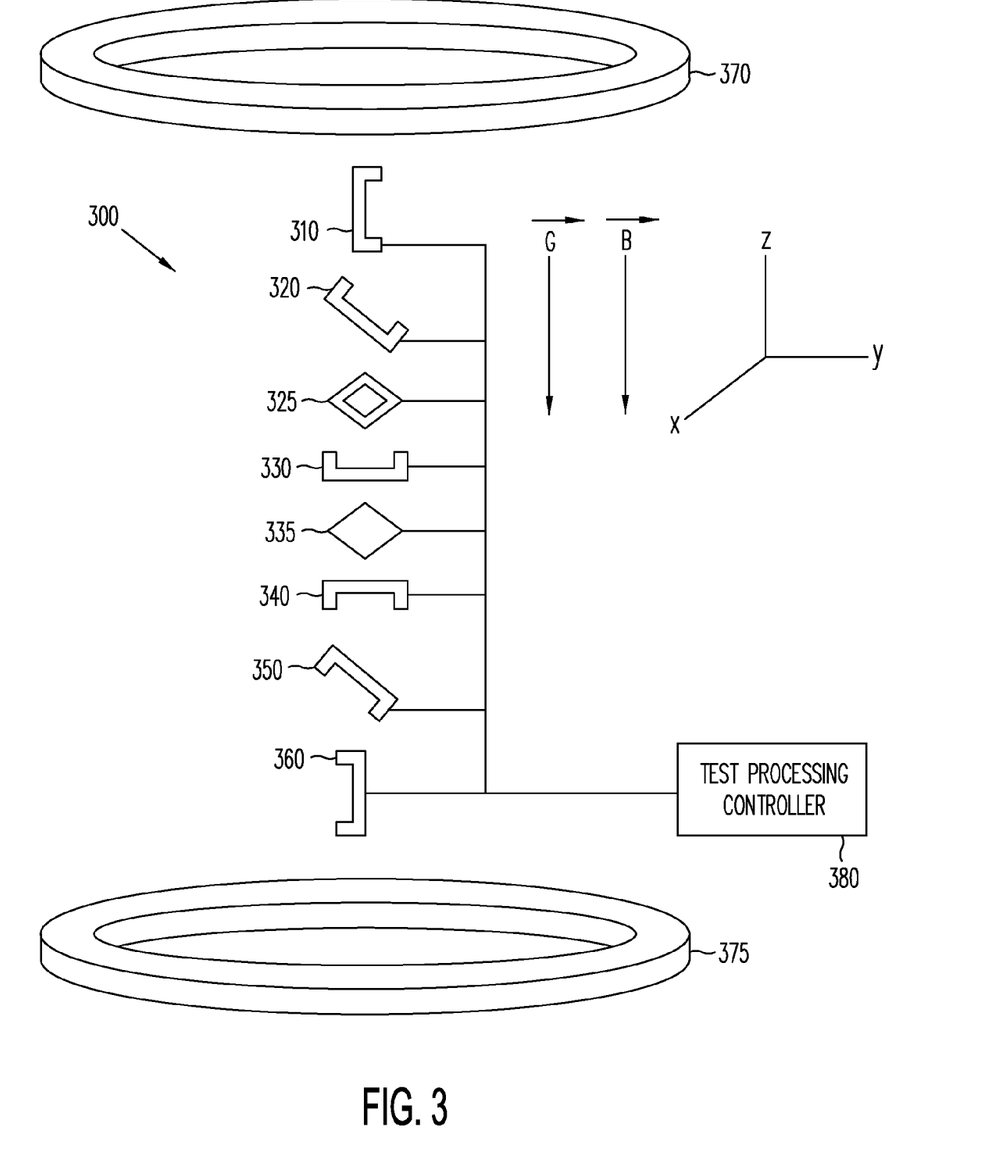
FIG. 3 is a simplified block diagram illustrating elements of a testing environment configured in accord with embodiments of the present invention.

FIG. 3 is a simplified block diagram illustrating elements of testing environment configured in accord with embodiments of the present invention. A goal of the illustrated system is to stimulate each directionally sensitive sensor device of a package containing a three-axis sensor configuration for testing and trimming. In order to do so, the semiconductor device package should be rotated to a variety of orientations with respect to a direction of two or more force vectors associated with forces of interest. FIG. 3 illustrates a series of test locations 310, 320, 325, 330, 335, 340, 350, and 360 within test environment 300. As will be discussed in more detail below, each test location can be a socket configured to receive the sensor package. Each socket is set at a fixed orientation to the force vectors of interest. A sensor package can be inserted into each socket, thereby orienting the sensor package in a predetermined manner to the force vectors.

Testing region 300 is further defined by a pair of Helmholtz coils 370 and 375. Helmholtz coils are used to generate a uniform magnetic field within the region between the coils. Thus, testing region 300 will be exposed to a magnetic field oriented along the Z axis illustrated in FIG. 3. Further, the direction of gravity in FIG. 3 is aligned with the Z axis and hence the magnetic field. It should be noted that the directional vectors of the fields of interest need not be oriented along a same axis, but those fields should be oriented any known relationship to one another in order to perform useful testing. Further, testing may be simplified by having the directional vectors of the fields in alignment.

FIG. 3 illustrates each of test locations 310, 320, 325, 330, 335, 340, 350, and 360 having different orientations with respect to the direction of the force of interest. By placing the sensor package being tested in each of the test locations, data generated by the sensors in response to their orientation to the force of interest can be gathered and subsequently used for calibration of the sensors in the device package. Sockets can be placed at each of the test locations, and those sockets are communicatively coupled with a test processing controller 380. Test processing controller 380 is configured to receive information generated by the sensor package at the test locations and to use that information to calculate trim information for the sensor package. How this information is supplied to the sensor package is described in greater detail below.

By having both a magnetic field and being exposed to a known gravitational field, both accelerometers and magnetometers within the sensor package can be tested at or about the same time at each test location. This avoids traditional approaches which require testing of accelerometer response to gravity and magnetometer response to a magnetic field separately. Further, sensor device packages can be introduced to and removed from testing region 300 while the Helmholtz coils are active, thereby avoiding issues related to cycling of power to generate a magnetic field found in traditional methods. In addition, since the sensor device packages being tested are rotated with respect to the fixed field directions of the forces of interest, the magnetic field can be generated by a pair of coils, rather than six coils oriented around the test region whose polarity is being changed to alter the direction of the magnetic field. The magnetic field can be set up in a single, constant direction, while the device under test is rotated within the field to test different responses to orientation.

Figure 4:
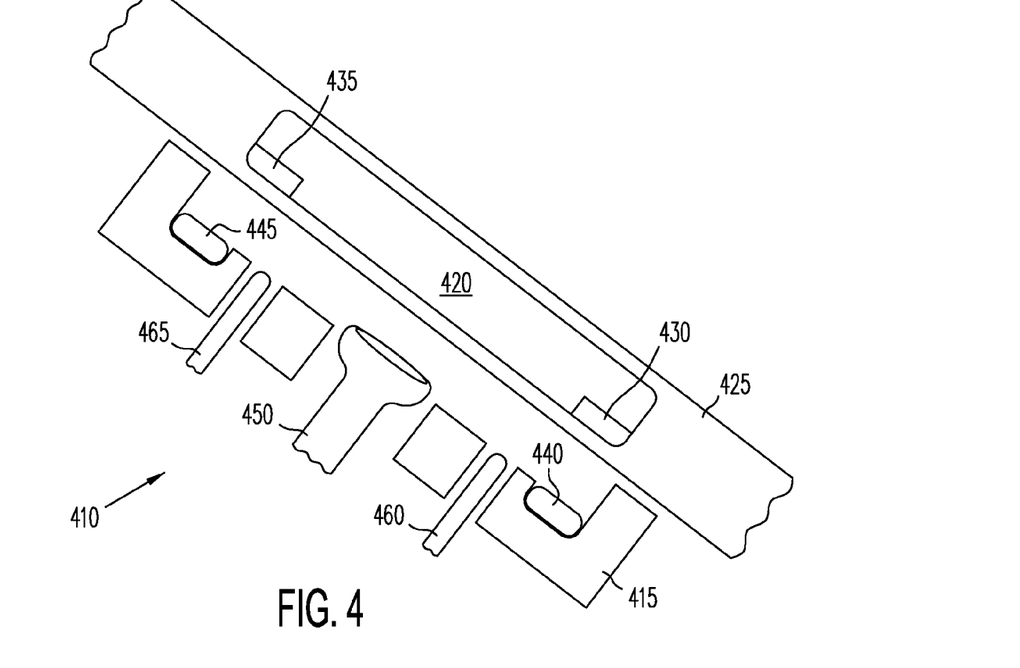
FIG. 4 is a simplified block diagram illustrating one example of a test location usable by embodiments of the present invention.

FIG. 4 is a simplified block diagram illustrating one example of a test location usable by embodiments of the present invention. Test location 410 includes a socket assembly 415. Socket assembly 415 is configured to receive a sensor package device under test (DUT) 420 from a feed mechanism 425. DUT 420 includes package electrical contacts 430 and 435 which are brought into contact with socket contacts 440 and 445, respectively, when the DUT is inserted into the socket assembly. In one embodiment, DUT 420 is inserted into a socket assembly 415 by the use of a vacuum plunger 450. Vacuum plunger 450 can be brought into contact with DUT 420 and a suction applied through the vacuum plunger to bring the device into the socket assembly.

Once the DUT is inserted into the socket assembly, power can be applied to the device under test and sensor data from both the accelerometers and magnetometers can be generated by the sensors in the DUT package and received by a testing device processor (e.g., test processing controller 380). As discussed above, the information generated by the various sensors can be ultimately used for trimming purposes.

After testing data has been produced, DUT 420 can be ejected from socket assembly 415 using, for example, ejection pins 460 and 465. In one embodiment, ejection pins 460 and 465 are configured to push the sensor package out of the socket assembly and back into feed mechanism 425. Feed mechanism 425 will then transport the DUT to a next test location for further testing at another orientation to the fields of interest.

In order to avoid disturbing uniformity of a magnetic field generated by the Helmholtz coils, embodiments of the present invention incorporate non-ferromagnetic materials in the test locations. For example, electrical contacts 440 and 445 can be fabricated out of aluminum. In addition, the sockets, vacuum plunger 450 and ejection pins 460 and 465 can be fabricated from a variety of plastic or nylon or other non-ferromagnetic components. Embodiments of the present invention are not limited to particular materials chosen for elements of the test locations.

Feed mechanism 425 can take a variety of forms. In one embodiment, the mechanism 425 is a track on which device packages to be tested can be transported from test location to test location. The track can twist along a path that optimally brings the semiconductor device packages to their test locations in a proper orientation for insertion. Such a track can include a tube in which a series of packages can be inserted and moved by gravity and pressure from other packages, or a holder can be provided for each package to be tested which can roll along the track to a next test location. Alternatively, feed mechanism 425 can include a robot arm that can orient the sensor package for insertion into the variety of device location sockets. For such a robot arm, care should be taken to avoid materials that can disturb the magnetic field in the region of the test locations (e.g., by using plastics or similar materials for the insertion arm and the like). Embodiments of the present invention are not limited to the mechanism by which device packages to be tested are moved from test locations test location.

Figure 5:
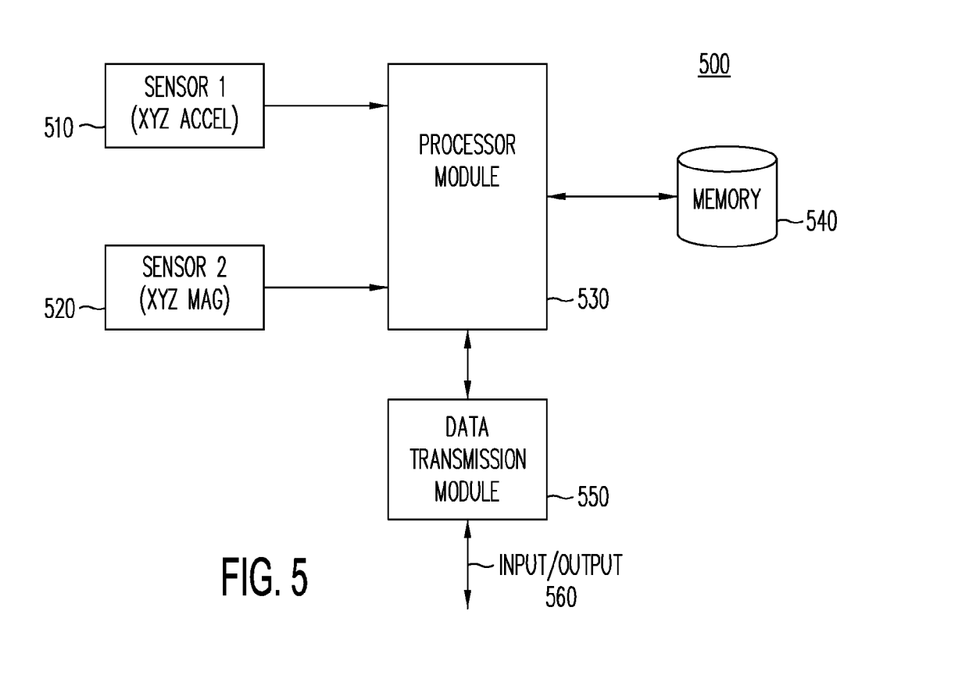
FIG. 5 is a simplified block diagram illustrating components of a typical sensor device package testable by embodiments of the present invention.

FIG. 5 is a simplified block diagram illustrating components of a typical sensor device package testable by embodiments of the present invention. Sensor device package 500 includes a first sensor 510 which is an XYZ accelerometer and a second sensor 520 which is an XYZ magnetometer. As discussed above, each sensor can actually incorporate three sub-sensors oriented orthogonally. Sensor 510 and sensor 520 are electrically coupled to a processor module 530. Signals from each of the orthogonal sensors in the first and second sensor die are provided to the processor module for interpretation. Sensor device package 500 also includes a memory 540 coupled to processor module 530, and which can store at least calibration information. Processor module 530 is also communicatively coupled to a data transmission module 550 that can input and output signals (560) to a receiver and/or transmitter external to sensor device package 500.

As discussed above, one rationale for performing the testing associated with testing region 300 is to provide calibration data for the DUT. Each sensor device package and the sensors within that package can have differences that cause that particular sensor device package to differ in performance from an optimal sensor device package. To compensate for this, calibration information relating how that sensor device package differs should be stored and used by the sensor device package. In the configuration illustrated in FIG. 5, such calibration, or trim, information is stored in memory 540. This calibration information can be generated by a test processing controller (e.g., 380) external to the sensor that receives all the test data generated for each of the sensors incorporated in the package, and utilizes that information to generate calibration or trim information. The test processing controller then communicates that information to the sensor device package through a communicative coupling (e.g., at the last test location or a subsequent socket).

Figure 6:
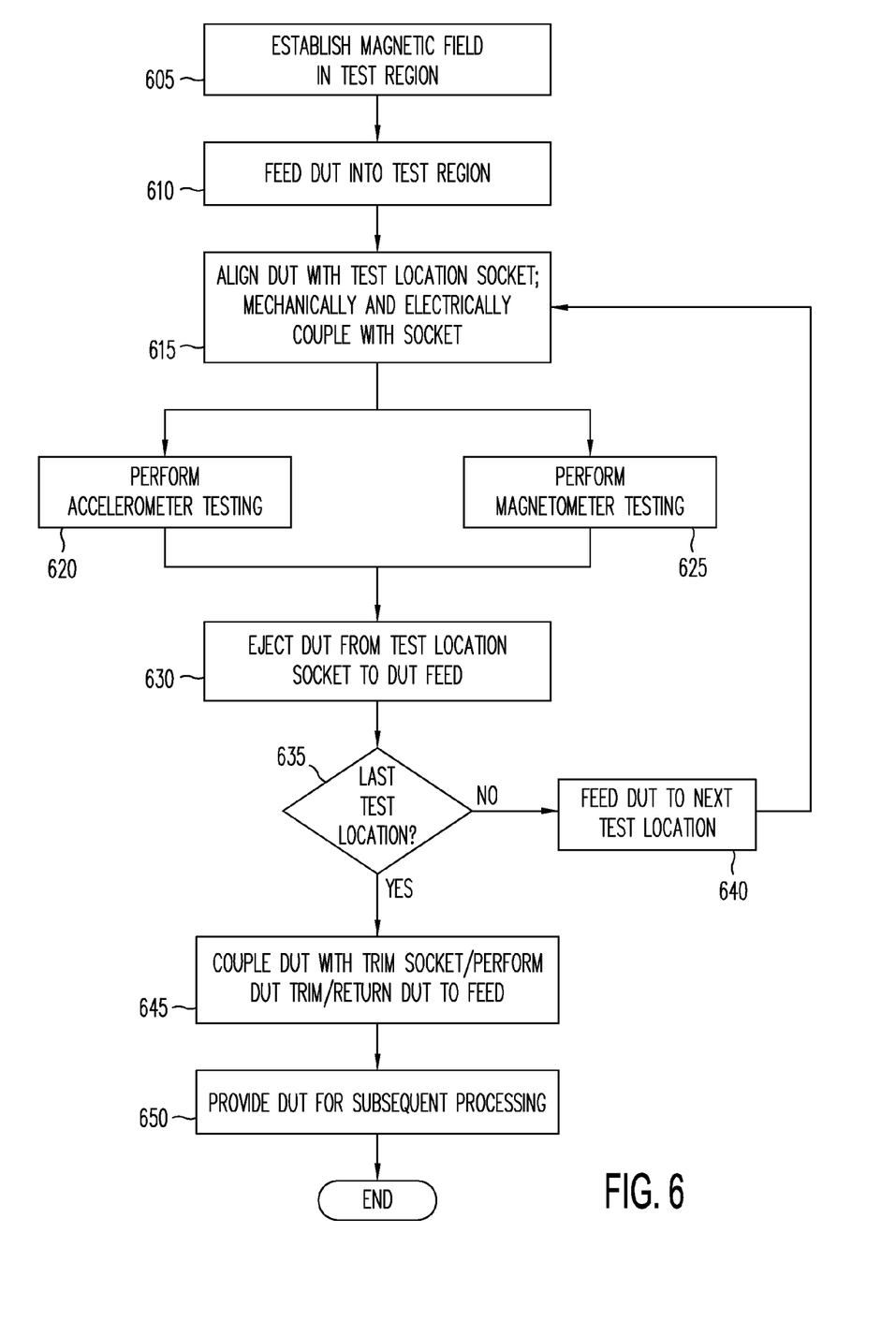
FIG. 6 is a simplified flow diagram illustrating a sequence of events usable to perform device testing in accord with embodiments of the present invention.

FIG. 6 is a simplified flow diagram illustrating a sequence of events usable to perform device testing in accord with embodiments of the present invention. Initially the test region is configured by establishing a magnetic field in the test region (605). As discussed above, by establishing the magnetic field prior to incorporation of devices under test within the test region, the DUTs are not subject to magnetic field overshoot during the stabilization of the magnetic field.

A DUT is then fed into the test region (610), using a feed mechanism provided (e.g., a track). The DUT is aligned with a test location sockets, and then mechanically and electrically coupled with the socket (615). In this manner, the DUT is placed at a known orientation to the fields of interest (e.g., magnetic field and gravitational field). Once the DUT is inserted into the socket and communication established, accelerometer testing can be performed (620) and magnetometer testing can be performed (625). Such testing is illustrated as being performed in parallel, but practical limitations of communication with the device under test may require that one or the other of accelerometer or magnetometer testing be performed first and then subsequently the other. However, advantages of the present invention are maintained because both sensor tests occur within a short period, maintaining the device in the same test location. Information associated with the testing is communicated to a test processing controller, which can then store that information in association with the known orientation of the device to the fields of interest.

After testing of the various sensors has been completed at the test location, the DUT is ejected from the test location socket to a device feed that will transport the device under test to a next location (630). If the test location is not the last test location (635), then the DUT is moved to the next test location (640) and the process is repeated.

If the test location is the last test location (635), then the DUT can be electrically coupled to a trim socket and a device trim operation performed (645). As discussed above, such trim operations include a calculation by the test processing controller of trim parameters and communication of those trim parameters to the DUT for storage in a memory of the DUT (e.g. memory 540). In subsequent operations of the tested sensor device package, the stored information can be used to modify the output from the sensors to provide accurate data to an external processor. Once the trim operations have been performed, the tested DUT can be provided to a device feed to a next station for subsequent processing (650).

Alternatively, a determination can be made that the DUT is in the last test location prior to ejecting the device under test from the socket. Trim information can then be provided to the DUT while the device remains in that socket, thereby avoiding the need for a separate trim socket and feeding of the device to that socket. Alternatively, trim information can be provided to the memory in the DUT during any communicative coupling performed subsequent to testing the device in the test region (e.g., in trim-specific sockets provided for final testing of a device).

Through the use of testing systems provided by embodiments of the present invention, sensor device packages incorporating directionally sensitive sensors for magnetic fields and gravitational fields can be tested in an efficient and straightforward manner. Both gravitational and magnetic field response can be tested in the same operation, thereby eliminating a sequential process for such testing. Further, since the sensor device packages can be tested after singulation, the sensor device packages are in a configuration more closely aligned with their ultimate use. Finally, testing systems provided by embodiments of the present invention have an advantage of being structurally simpler and provide more repeatable results than previously used gimbaled test systems.

By now it should be appreciated that there has been provided a system that includes a test environment subject to a first vector associated with a first directional force and a second vector associated with the second directional force, a device under test that includes a first set of directionally sensitive sensors sensitive to the first directional force and a second set of directionally sensitive sensors sensitive to the second directional force, a first test location within the test environment that is configured to receive the device under test and position the device under test in a fixed relationship to a first known orientation to both the first and second vectors, and a processor communicatively coupled to the first test location. The processor is configured to receive signals from the device under test at the first test location and transmit one or more trim signals to the device under test. The signals are responsive to the first set of directionally sensitive sensors response to the first directional force at the first known orientation and are responsive to the second set of directionally sensitive sensors response to the second directional force at the first known orientation. In one aspect of the above embodiment, the one or more trim signals are responsive to the received signals from the device under test at the first test location.

Another aspect of the above embodiment includes a second test location within the test environment in which the second test location is positioned in a second known orientation to both the first and second vectors, the second known orientation is different from the first known orientation, and the second test location is configured to receive the device under test and position the device under test in a fixed relationship to the second known orientation. In addition, the processor is communicatively coupled to the second test location and configured to receive signals from the device under test at the second test location and transmit one or more second trim signals to the device under test. The second signals are responsive to the first of directionally sensitive sensors response to the first directional force at the second known orientation and are responsive to the second set of directionally sensitive sensors response to the second directional force at the second known orientation. Further, the one or more second trim signals are responsive to the received signals from the device under test at the first test location and the second test location. In a further aspect, a feed mechanism is configured to transport the device under test from the first test location to the second test location. In still a further aspect, the feed mechanism includes a track along which the device under test can move from the first test location to the second test location. In an alternate further aspect, the feed mechanism includes a mechanical mechanism configured to move the device under test from the first test location to the second test location.

In another aspect of the above embodiment, the system further includes a magnetic field generator configured to generate the first directional force, wherein the first directional force is uniform throughout the test environment. In a further aspect, the magnetic field generator includes a first Helmholtz coil and a second Helmholtz coil. In another further aspect, the second directional force is gravity.

In another aspect of the above embodiment, the first vector describing a direction of the first directional force and the second vector describing a direction of the second directional force are in alignment. In another aspect of the above embodiment, the first test location is constructed of materials that maintain uniformity of the first and second directional forces.

In still another aspect of the above embodiment, the first set of directionally sensitive sensors include a first set of three orthogonally oriented sensors and the second set of directionally sensitive sensors include a second set of three orthogonally oriented sensors. Further, the first set of directionally sensitive sensors are configured to respond to a magnetic field, while the second set of directionally sensitive sensors are configured to respond to an acceleration (e.g., gravity).

In another embodiment of the present invention, a method is provided for testing a semiconductor device package that includes first and second sets of directionally sensitive sensors, the first set sensitive to a first directional force and the second set sensitive to a second directional force. The method includes orienting the semiconductor device package in a first known orientation to each of the first and second directional forces, testing the first of directionally sensitive sensors, testing the second set of directionally sensitive sensors, and subsequent to said testing the first and second sets of directionally sensitive sensors reorienting the semiconductor device package to a second known orientation to each of the first and second directional forces.

In one aspect of the above embodiment, orienting the semiconductor device package in a first known orientation to each of the first and second directional forces includes providing a first test socket and inserting the semiconductor device package in the first test socket. The first test socket is configured to receive the semiconductor device package and the first test socket is oriented in the first known orientation to the first and second directional forces.

In another aspect of the above embodiment, testing the first set of directionally sensitive sensors includes stimulating the first set of directionally sensitive sensors with the first directional force and receiving a signal from the first set of directionally sensitive sensors where the signal is responsive to the stimulating. In a further aspect, the first set of directionally sensitive sensors includes an orthogonally-oriented set of magnetometers and the first directional force is a magnetic field. Still a further aspect provides for forming the magnetic field using a pair of Helmholtz coils, where forming the magnetic field is initiated before orienting the semiconductor device package and the magnetic field is maintained throughout said testing and subsequent to the reorienting.

In another aspect, testing the second set of directionally sensitive sensors includes stimulating the second set of directionally sensitive sensors with the second directional force, and receiving a signal from the second set of directionally sensitive sensors, where the signal is responsive to said stimulating the second set of directionally sensitive sensors. Simulating the second set of directionally sensitive sensors is performed at about the same time as said stimulating the first of directionally sensitive sensors. In a further aspect, the second set of directionally sensitive sensors includes an orthogonally oriented set of accelerometers and the second directional force is gravity.

Another aspect of the above embodiment further includes performing testing of the first and second sets of directionally sensitive sensors and the second known orientation to the first and second directional forces, performing testing of the first and second sets of directionally sensitive sensors and one or more additional known orientation to each of the first and second directional forces, collecting data corresponding to signals produced by the first and second sets of directionally sensitive sensors at each of the known orientation, calculating trim information for the first and second sets of directionally sensitive sensors in response to the corrected data, and storing the trim information in a memory associated with the semiconductor device package.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, test processing controller 380 can be implemented by a variety of information processing systems and embodiments of the present invention are not limited to any particular information processing architecture.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be received elements of system 300, for example, from computer readable media such as a memory or other media on other computer systems. Such computer readable media may be permanently, removably or remotely coupled to test processing controller 380. The computer readable media may include, for example and without limitation, any number of the following: magnetic storage media including disk and tape storage media; optical storage media such as compact disk media (e.g., CD ROM, CD R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

In one embodiment, test processing controller 380 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A system comprising:
    a test environment subject to a first vector associated with a first directional force and a second vector associated with a second directional force;
    a device under test comprising a first set of directionally sensitive sensors sensitive to the first directional force and a second set of directionally sensitive sensors sensitive to the second directional force;
    a first test location within the test environment, wherein the first test location is positioned in a first known orientation to both the first and second vectors, and the first test location is configured to receive the device under test and position the device under test in a fixed relationship to the first known orientation; and a processor, communicatively coupled to the first test location, and configured to
  receive signals from the device under test at the first test location, wherein the signals are responsive to the first set of directionally sensitive sensors response to the first directional force at the first known orientation and are responsive to the second set of directionally sensitive sensors response to the second directional force at the first known orientation, and
  transmit one or more trim signals to the device under test.

2. The system of claim 1 wherein the one or more trim signals are responsive to the received signals from the device under test at the first test location.

3. The system of claim 1 wherein the first vector describing a direction of the first directional force and the second vector describing a direction of the second directional force are in alignment.

4. The system of claim 1 wherein the first test location is constructed of materials that maintain uniformity of the first and second directional forces.

5. The system of claim 1, wherein
  the first set of directionally sensitive sensors comprises a first set of three orthogonally oriented sensors, wherein the three orthogonally sensitive sensors are configured to respond to a magnetic field; and
  the second set of directionally sensitive sensors comprises a second set of three orthogonally oriented sensors, wherein the second set of three orthogonally oriented sensors are configured to respond to an acceleration.

6. The system of claim 1 further comprising:
  magnetic field generator configured to generate the first directional force, wherein the first directional force is uniform throughout the test environment.

7. The system of claim 6 wherein the magnetic field generator comprises a first Helmholtz coil and a second Helmholtz coil.

8. The system of claim 6 wherein the second directional force is gravity.

9. The system of claim 1 further comprising:
  a second test location within the test environment, wherein
    the second test location is positioned in a second known orientation to both the first and second vectors, wherein the second known orientation is different from the first known orientation, and
    the second test location is configured to receive the device under test and position the device under test in a fixed relationship to the second known orientation; and
  the processor is communicatively coupled to the second test location, and configured to
    receive second signals from the device under test at the second test location, wherein the second signals are responsive to the first set of directionally sensitive sensors response to the first directional force at the second known orientation and are responsive to the second set of directionally sensitive sensors response to the second directional force at the second known orientation, and
    transmit one or more second trim signals to the device under test, wherein the one or more second trim signals are responsive to the received signals from the device under test at the first test location and the second test location.

10. The system of claim 9 further comprising:
  a feed mechanism configured to transport the device under test from the first test location to the second test location.

11. The system of claim 10 wherein the feed mechanism comprises a track along which the device under test can move from the first test location to the second test location.

12. The system of claim 10 wherein the feed mechanism comprises a mechanical mechanism configured to move the device under test from the first test location to the second test location.

13. A method for testing a semiconductor device package comprising first and second sets of directionally sensitive sensors, the first set sensitive to a first directional force and the second set sensitive to a second directional force, the method comprising:
  orienting the semiconductor device package in a first known orientation to each of the first and second directional forces;
  testing the first set of directionally sensitive sensors;
  testing the second set of directionally sensitive sensors;
  subsequent to said testing the first and second sets of directionally sensitive sensors, re-orienting the semiconductor device package to a second known orientation to each of the first and second directional forces.

14. The method of claim 13 wherein said orienting the semiconductor device package in a first known orientation to each of the first and second directional forces comprises:
  providing a first test socket, wherein
    the first test socket is configured to receive the semiconductor device package, and
    the first test socket is oriented in the first known orientation to the first and second directional forces; and
  inserting the semiconductor device package in the first test socket.

15. The method of claim 13 further comprising:
  performing testing of the first and second sets of directionally sensitive sensors at the second known orientation to the first and second directional forces;
  performing testing of the first and second sets of directionally sensitive sensors at one or more additional known orientations to each of the first and second directional forces;
  collecting data corresponding to signals produced by the first and second sets of directionally sensitive sensors at each of the known orientations;
  calculating trim information for the first and second sets of directionally sensitive sensors in response to the collected data; and
  storing the trim information in a memory associated with the semiconductor device package.

16. The method of claim 13 wherein said testing the first set of directionally sensitive sensors comprises:
  stimulating the first set of directionally sensitive sensors with the first directional force;
  receiving a signal from the first set of directionally sensitive sensors, the signal responsive to said stimulating.

17. The method of claim 16, wherein
  the first set of directionally sensitive sensors are an orthogonally-oriented set of magnetometers, and
  the first directional force is a magnetic field.

18. The method of claim 17 further comprising:
  forming the magnetic field using a pair of Helmholtz coils, wherein
    said forming the magnetic field is initiated before said orienting the semiconductor device package, and
    the magnetic field is maintained throughout said testing and subsequent to said re-orienting.

19. The method of claim 16 wherein said testing the second set of directionally sensitive sensors comprises:
- stimulating the second set of directionally sensitive sensors with the second directional force;
- receiving a signal from the second set of directionally sensitive sensors, the signal responsive to said stimulating the second set of directionally sensitive sensors, wherein
    - said stimulating the second set of directionally sensitive sensors is performed at about the same time as said stimulating the first set of directionally sensitive sensors.

20. The method of claim 19, wherein
the second set of directionally sensitive sensors are an orthogonally oriented set of accelerometers, and
the second directional force field is gravity.

* * * * *